United States Patent [19]

Williams

[11] Patent Number: 5,109,479

[45] Date of Patent: Apr. 28, 1992

[54] METHOD OF DESIGNING THREE DIMENSIONAL ELECTRICAL CIRCUITS

[75] Inventor: John D. Williams, Bear, Del.

[73] Assignee: AMP-AKZO Corporation, Hauppague, N.Y.

[21] Appl. No.: 404,262

[22] Filed: Sep. 7, 1989

[51] Int. Cl.⁵ ............................................. G06F 15/72
[52] U.S. Cl. ..................................... 395/125; 364/489
[58] Field of Search ....................... 364/522, 491, 489

[56] References Cited

U.S. PATENT DOCUMENTS

| | | | |
|---|---|---|---|
| 3,653,071 | 3/1972 | Hill et al. | 364/491 X |
| 4,638,442 | 1/1987 | Bryant et al. | 364/489 |
| 4,805,091 | 2/1989 | Thiel et al. | 364/200 |
| 4,845,643 | 7/1989 | Clapp | 364/527 X |
| 4,888,713 | 12/1989 | Falk | 364/522 |
| 4,908,772 | 3/1990 | Chi | 364/491 |
| 4,953,107 | 8/1990 | Hedley et al. | 364/522 |
| 4,964,057 | 10/1990 | Yabe | 364/491 |

Primary Examiner—Gary V. Markcom
Assistant Examiner—Mark K. Zimmerman
Attorney, Agent, or Firm—Morgan & Finnegan

[57] ABSTRACT

A computer aided design package is used to create a mathematical representation of a three-dimensional object. This object is defined as a set of surfaces oriented in space. A map of the flattened object is created by concatenating selected ones of the surfaces on a single plane. The outline of this map is then used in a computer aided circuit layout package as a printed circuit board on which an electrical circuit is placed and routed. The circuit is translated into a three dimensional form corresponding to the surface of the object by translating and rotating the representation of the object to align each selected surface with the circuit description generated by the circuit layout package. The portion of the circuit corresponding to the surface is then transferred to a three-dimensional data structure having a format that is compatible with numerically controlled machining apparatus. This data structure is used to drive a numerically controlled machine tool that cuts a phototool. This phototool is a three-dimensional mask that may be used to print the circuit on the surface of the three-dimensional object.

4 Claims, 8 Drawing Sheets

METHOD OF DESIGNING THREE DIMENSIONAL ELECTRICAL CIRCUITS

A portion of this patent document contains material which is subject to copyright protection. The owner has no objection to the facsimile reproduction by anyone of the patent document or patent disclosure as it appears in the Patent and Trademark Office patent file or records, but otherwise reserves all rights whatsoever.

BACKGROUND OF THE INVENTION

Field of the Invention

The present invention relates generally to the design of electrical circuits and specifically to a method of producing electrical circuits on the surfaces of three-dimensional objects.

Many electrical or electronic circuits are made by means of printed circuit boards (PCB's) in which electrical conduction paths are defined as traces of copper on the surfaces of a flat sheet of insulating material. In more complex versions, there may be multiple layers of circuit, for example, on the two sides of the PCB, which are connected to each other by plated through holes or vias in the PCB.

PCB's provide both electrical connection and mechanical support for electronic components such as resistors, capacitors and integrated circuits. In addition, PCB's may include connectors used to couple the circuit, for example, to power sources, transducers or to other circuits. Generally, PCB's are protected and supported in cases or other structures to make usable appliances.

In contradistinction to the flat two-sided nature of the conventional PCB, a molded circuit board (MCB) is generally a three-dimensional object, having multiple surfaces. Thus, an MCB may combine both mechanical features and electrical functions into one artifact.

This combined functionality is not achieved without some cost, since the design of such an MCB combines the mechanical design technology of molded or solid parts with circuit layout methods used to make PCB's. While there are readily available computer software packages or program suites that can aid designers in either of these fields, these programs are generally incompatible and, so, difficult to use in combination. This incompatibility is fundamental to the design methodologies and is not merely an issue of translating between different data formats.

The software packages for circuit design allow information about the placement of components on the PCB and the required connections among these components to be provided as an input data file, such as a netlist. The subsequent work of laying out the traces and vias is constrained by the obligation to meet topological restrictions imposed by the input data file. Many of these program packages provide automatic trace routing algorithms which do some or all of the job with varying degrees of competence. All packages allow manual routing, in which traces and vias may be moved on the PCB while the circuit connections are preserved. Neither the automatic algorithms nor the ability to move traces and vias is a part of the available methodology of conventional mechanical engineering design packages used to design three-dimensional objects. Conversely, the circuit layout and design packages do not admit of the existence of a third dimension, except in that they may provide for several parallel layers of circuit traces and the local connection between them.

The interrelationship between electrical and mechanical designs is very strong. Even in the design of flat circuit boards, the through-holes which link circuit traces on opposite sides of the board and the holes which are used to support or attach components to the board are recognized as existing on all layers. Furthermore, many of these holes (i.e. vias) are logically associated with the traces.

When a designer adjusts a design in the electrical design package by moving a trace and, so, causing a via to be moved, the computer software attempts to preserve the electrical-mechanical relationship by adjusting the routing on all layers of the board to conform to the new position of the via. Thus, in the electrical packages, a mechanical feature is automatically adapted to circuit requirements. In the mechanical engineering design packages, such topological relationships are not recognized. Mechanical features such as patterns of holes may be moved as a group, but, in general, there is no way of relating these features to the continuity of adaptable decorative details on the surface of the object.

In attempting to extend circuit layout to surfaces in three dimensions, a new set of problems arise due to the limitations of the two-dimensional circuit layout tools. When a solid part is to have circuit traces drawn, for example, on its inner and outer surfaces, electrically identical traces on the two surfaces may be very different due to the thickness of the part near edges or corners, or due to features that break the surface on one side but are not replicated on the other side. Thus, features such as stiffening ribs, standoffs, outer walls and mounting structures may make the topologies of two sides of an object very different.

In the implementation of the design of a molded part, tools are generally used which carry, in mechanical form, the image of what would be the artwork (i.e. traces and connecting pads) in normal two-dimensional circuit processes. In some cases, these tools may be generated using normal circuit board processes, for example, when the part includes flat areas which can be dealt with as simple locally flat boards. However, to obtain full benefit of integrating mechanical and electrical designs, it is desirable to allow the traces to follow shaped surfaces. To do this, the tools which are used to form the part should impose the traces on the part.

However, these tools are themselves solid objects which are fabricated by mechanical means such as machining or casting. Consequently, the traces and vias which constitute the electrical circuit should be specified in whatever system is used to fabricate the tools, be it mechanical drawings interpreted by a skilled machinist or input data files which are used to direct the motion of a numerically controlled machine tool.

SUMMARY OF THE INVENTION

The present invention is embodied in a method of adapting a two-dimensional circuit representation to a three-dimensional object. According to this method, a two-dimensional circuit representation, prepared by conventional techniques and corresponding to multiple surfaces on the three-dimensional object, is mapped onto the object one section at a time. As each section is mapped, data corresponding to traces and vias are transferred from the two-dimensional circuit representation to a data file containing a three-dimensional representations of the circuit as it is to be imposed on the surfaces of the object. This data file is then used to produce the circuit on the surface of the three-dimensional object.

DETAILED DESCRIPTION

Overview

The design process of an MCB begins with the creation of a three-dimensional model of the part. For the described embodiment of the invention, this three-dimensional model is generated on an Apollo workstation using the GMS CAD-CAM system of Unisys Corporation as the mechanical design package. In this system, a three-dimensional object is specified as a set of quadrilateral surfaces in three dimensions. These surfaces are also known as ruled surfaces. The mechanical package produces a data file describing the three-dimensional object. In the present embodiment of the invention, this file is in Initial Graphics Exchange Specification (IGES) format. An exemplary object is described below with reference to FIG. 1.

The next step in the process is to "unfold" this three-dimensional object to generate a two-dimensional map of the ruled surfaces which, in the final artifact, are to include circuitry. In the present embodiment of the invention, this step is performed by concatenating the ruled surfaces, generated using the GMS package, to produce an outline representing a two-dimensional PCB. As set forth below, although this outline should approximate the outline of the concatenated ruled surfaces, it is not necessarily isomorphic with the three-dimensional object. The process of generating an outline of this type is described below with reference to FIG. 2.

Figure 3:
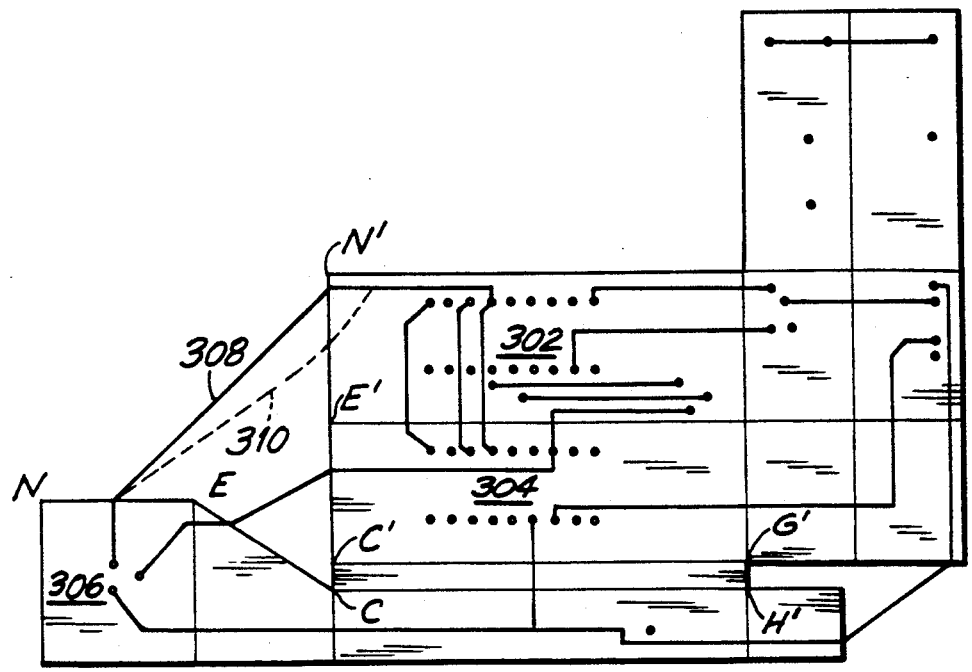
FIG. 3 is a circuit trace diagram placed and routed onto the image shown in FIG. 2.

The two-dimensional outline is generated, from data describing the concatenated surfaces, in an electrical design package, such as the Visula system produced by Racal Redac. This design package is also used to specify the placement of features such as connecting pads and vias which define both electrical and mechanical coupling of circuit components. When these features have been placed, the electrical package is used to define a routing for traces that connect these pads and vias as indicated by the circuit description. For this embodiment of the invention, the placement is accomplished by an operator specifying the position of vias and the position and size of pads on the two-dimensional surface. The pads are identified as being associated with specific components or with specific networks in the netlist. For the exemplary electrical design package set forth above, the routing operation is performed automatically to link the connecting pads and vias as indicated by the netlist file. The electrical package produces a data file describing the placed and routed circuitry. In this embodiment of the invention, this file is a GERBER photoplotter file. FIG. 3 is an example of a circuit routing produced by the electrical package.

The GERBER file describes a connecting pad as a point on the two-dimensional surface and an aperture for a beam of light which is flashed on to produce an image of the pad on a photosensitive material. A trace is defined as a starting point, an ending point and an aperture for a beam of light which follows a path between the starting and ending points to produce an image of the trace.

Figure 4:
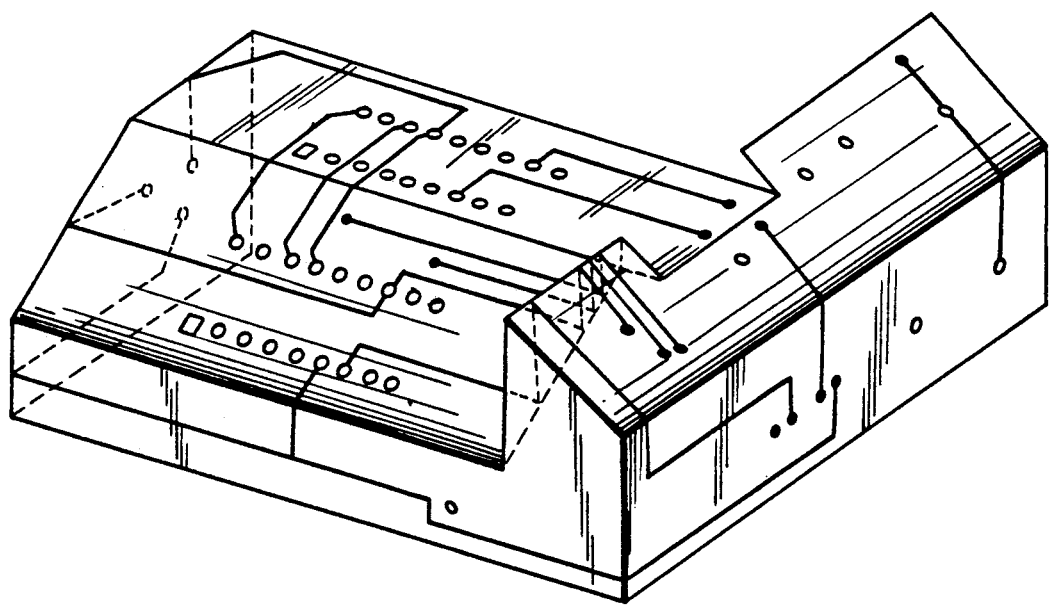
FIG. 4 is a perspective view of the object shown in FIG. 1 with the circuit represented by the circuit trace diagram of FIG. 3 mapped onto its surfaces.

After the circuit has been placed and routed, the data files representing the three-dimensional object and the two-dimensional circuit diagram are combined by a program, which also runs on the Apollo workstation, to generate a data file representing a three-dimensional object having a three-dimensional circuit imposed on its surfaces. This program combines the two files by using space transformation algorithms which "rotate" a mathematical representation of the object in space to align each surface with a portion of the circuit diagram. As each surface is aligned, the circuitry circumscribed by that surface is removed from the data file for the circuit diagram and added to a data file for the three-dimensional circuit. In the exemplary embodiment of the invention, this program produces an IGES file which describes a mask that may be applied to the object generated in the first step to impose the circuitry on that object. FIG. 4 is an illustration of an exemplary mask.

Detailed Description of the Preferred Embodiment of the Invention

The present invention is described below with reference to the exemplary three-dimensional object, shown in a perspective view in FIG. 1. This object includes seven surfaces: 101, a hidden surface in the view shown in FIG. 1 that is bounded by vertices A, C, E, N and O; 102, bounded by vertices A, B, J, G and C; 103, bounded by vertices C, E, F and H; 104, bounded by vertices E, N, M and F; 105, bounded by vertices F, G, J, Q, P, M and L; 106, bounded by B, R, Q and J; and 107, a hidden surface in the view of FIG. 1 that is bounded by vertices H, G, F and S.

As set forth above, this representation of the object may be generated using the mechanical design package. The object is generated one surface at a time, where each surface is a quadrilateral. To specify a surface, two line segments are described in terms of X, Y, and Z coordinates and the endpoints of these segments are joined to form the quadrilateral. It is noted that some of the surfaces shown in FIG. 1 are actually composed of two or more quadrilaterals. For example the surfaces 102 and 105 are respectively composed of two and three quadrilaterals.

Figure 1:
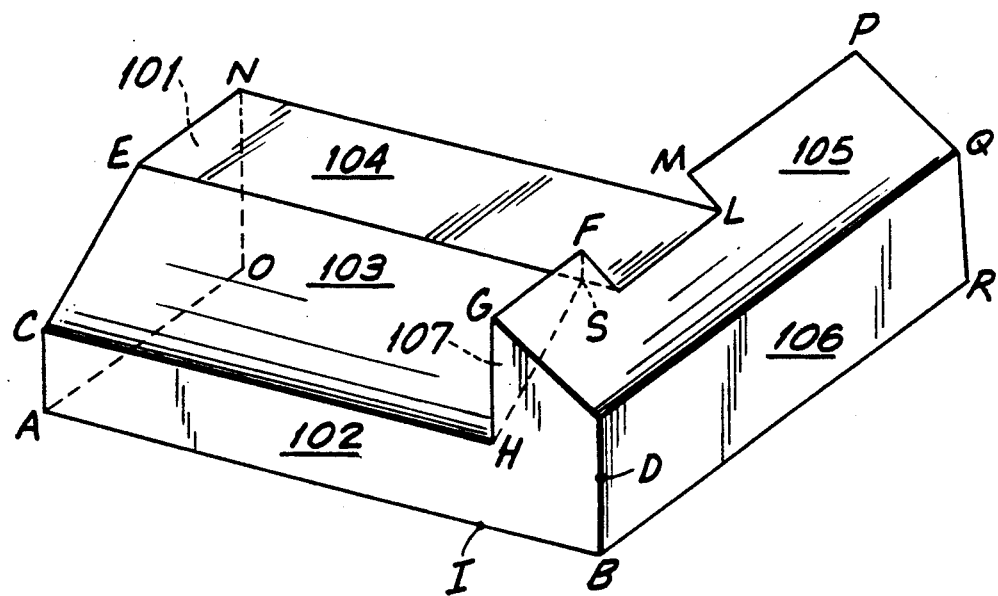
FIG. 1 is a perspective view of an exemplary three-dimensional object suitable for use with the present invention.
Figure 2:
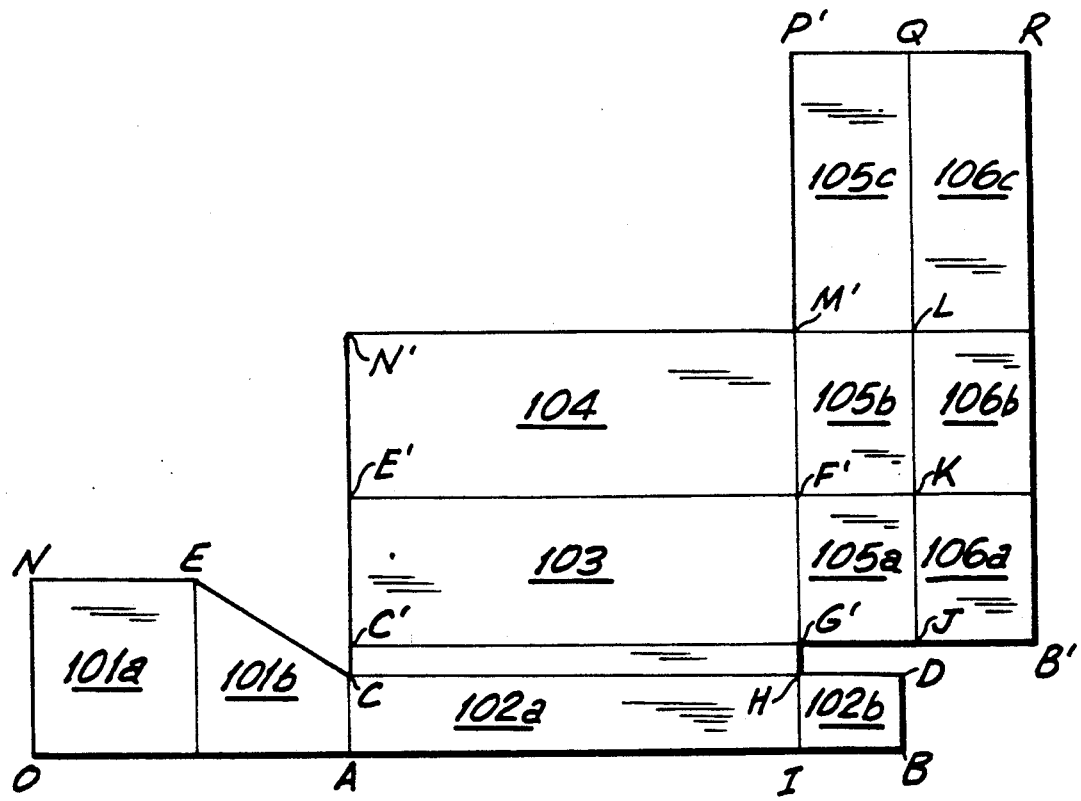
FIG. 2 is plan drawing which illustrates the unfolding of the object shown in FIG. 1 to create a two-dimensional image of the object.

The next step in the process is to generate a two-dimensional circuit layout area by concatenating the surfaces of the object shown in FIG. 1. This process resembles the generation of a two-dimensional map of the three-dimensional object. This step is performed using the mechanical package. Each surface of the three-dimensional object is copied and referenced to a common plane. The various surfaces are then oriented so that adjacent surfaces are joined. However, some surfaces which are contiguous in the three dimensional object are separated as a result of the mapping process. An exemplary map is shown in FIG. 2.

A set of dimensions which describe the outer boundaries of the concatenated surface are applied as input values to the electrical package to create an equivalent two-dimensional map upon which the circuit is to be placed and routed. In order to link the map to the three-dimensional object, one vertex is selected as a common orienting point. In this exemplary map, the orienting point is the vertex O.

The map used by the electrical package does not need to be an accurate representation of every surface of the object. In FIG. 2, for example, the quadrilateral defined by the vertices D, J, G and H has been omitted from the map and the surface 107, defined by the vertices H, S, F and G, has been incorporated into the map by lengthening the horizontal dimensions of the surfaces 103, 104, 105a, 105b and 105c.

The surface 107 is handled in this manner so that the map may have a regular structure suitable for use by the electronics package. The inventor has determined that the routing achieved with this outline is more effective than that which may be achieved from a more isomorphically mapped outline. Since the width of the surface 107 has been accounted for by lengthening the surfaces 103 and 105a, any circuit laid out in the portion of the map near the junction of these two surfaces will be transferred onto surface 107.

Circuitry may or may not be transferred to the omitted surface defined by the vertices D, J, G and H. This depends on the order in which the surfaces are evaluated when the two-dimensional circuit is applied to the three-dimensional object. However, the portions of an object which are to be occupied by circuitry may be limited to selected adjacent surfaces by concatenating only those surfaces to generate the outline. A vertex of one of these surfaces should then be chosen as the orienting point of the outline.

For the purposes of the electrical package, the area onto which the circuit may be placed is represented by the outline of the map shown in FIG. 2, with the respective pairs of vertices C and C' and H and G' joined as indicated. The boundaries of the individual surfaces which were concatenated to generate this map are ignored by the electrical package.

The circuit produced by the electrical package for this example is shown in FIG. 3. This circuit was generated by defining connecting pads and vias corresponding to two integrated circuits (302 and 304) and a transistor (306) as well as various other pads and vias as indicated. In the electrical package, the individual vias are labeled to correspond to networks, or nets, of a circuit defined by a netlist data file. The electrical package then routes the circuit defined by this netlist onto the outline generated by the mapping process. FIG. 3 shows the result of this routing operation.

In the circuit diagram shown in FIG. 3, traces have been placed in the void region defined by the vertices N, E, C, C', E' and N'. If this were a flat board, traces such as these would generate an error indication from the electrical package. In this instance, however, the edge defined by the vertices N', E' and C' is joined to the edge defined by the vertices N, E and C in the three-dimensional object and, so, the void does not actually exist. Depending on the electrical package used, some error checking may need to be deimplemented to allow traces to be routed across voids of this type.

Care should be exercised, where traces have been placed across voids, to ensure that the ends of traces on opposite sides of the void are properly aligned for the three-dimensional object. For example, consider the trace 308 generated by the electrical package. If the portions of this trace which extend across the void were omitted from the three-dimensional object, there would be no electrical connection because the end of the trace at the edge N'—E' would not meet the end of the corresponding trace at the edge N—E. To correct this problem, the operator of the electrical package moves the trace 308 to the position 310 indicated in phantom. Other traces which extend across voids should be examined for similar adjustment.

If circuitry is to be placed on both sides of the three-dimensional object, each of the steps set forth above would be performed separately for the inner and outer surfaces of the object. In the present embodiment of the invention, the operator is responsible for ensuring that any differences in surface area due to curvature of the three-dimensional object or due to the thickness of its walls are properly represented by the generated circuit outlines.

Figure 5:
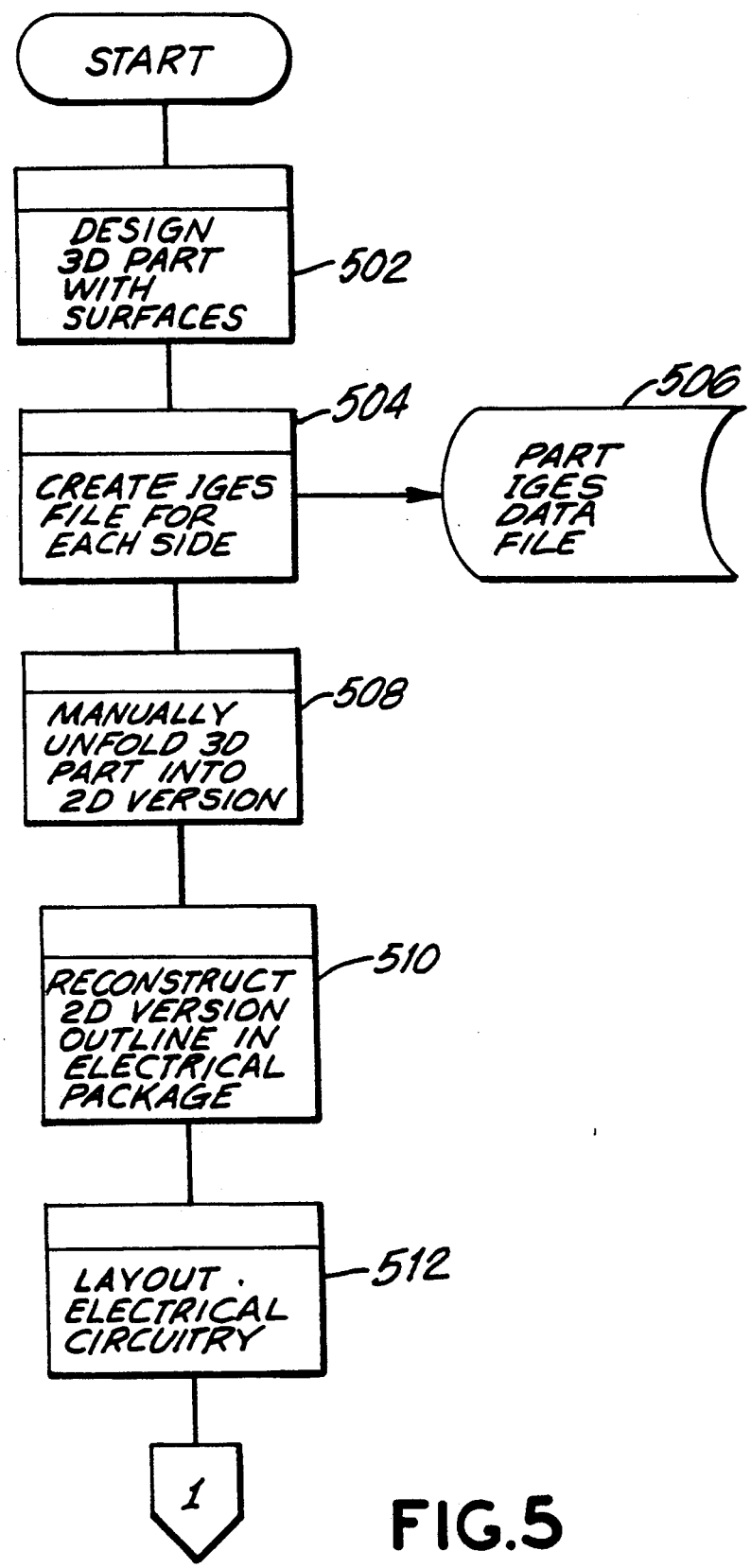
FIGS. 5-10 are flow-chart diagrams which are useful for describing the present invention.
Figure 6:
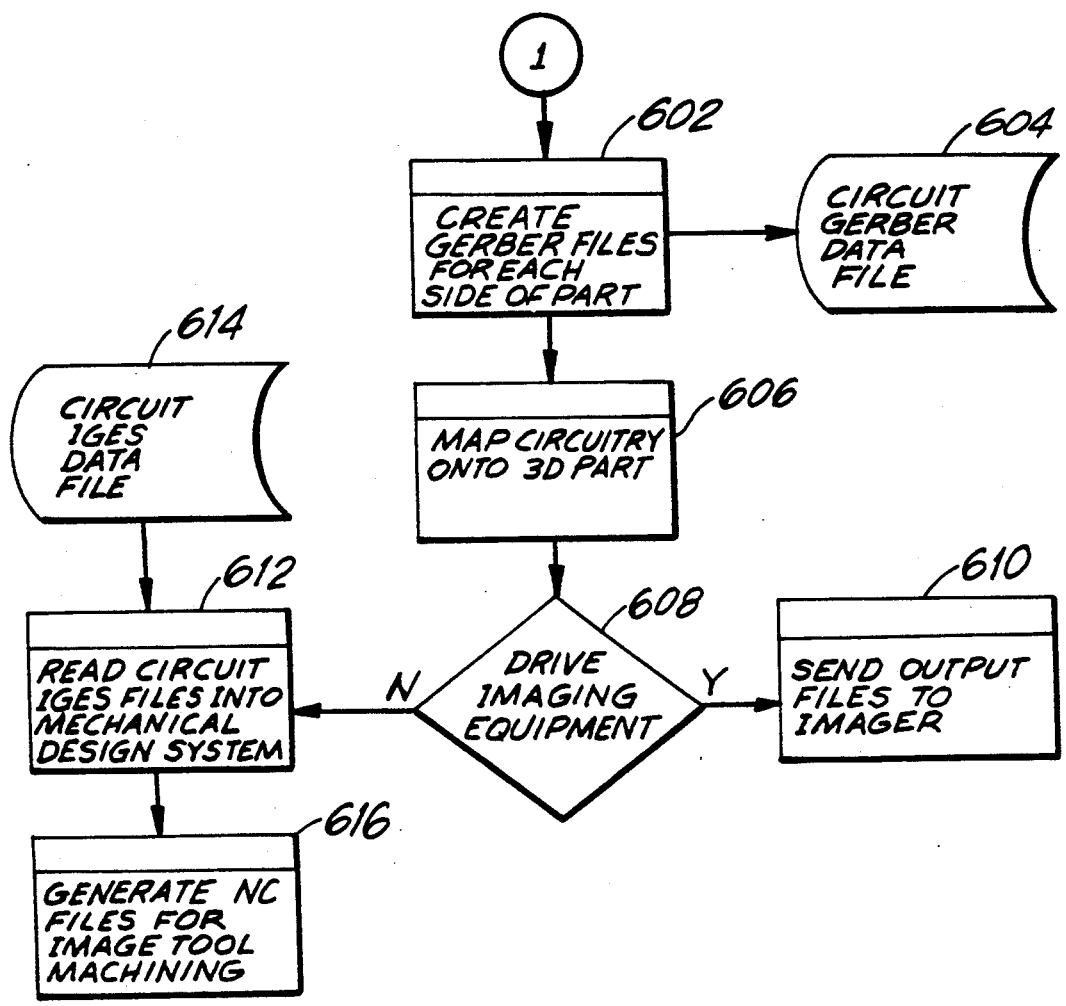
Figure 7:
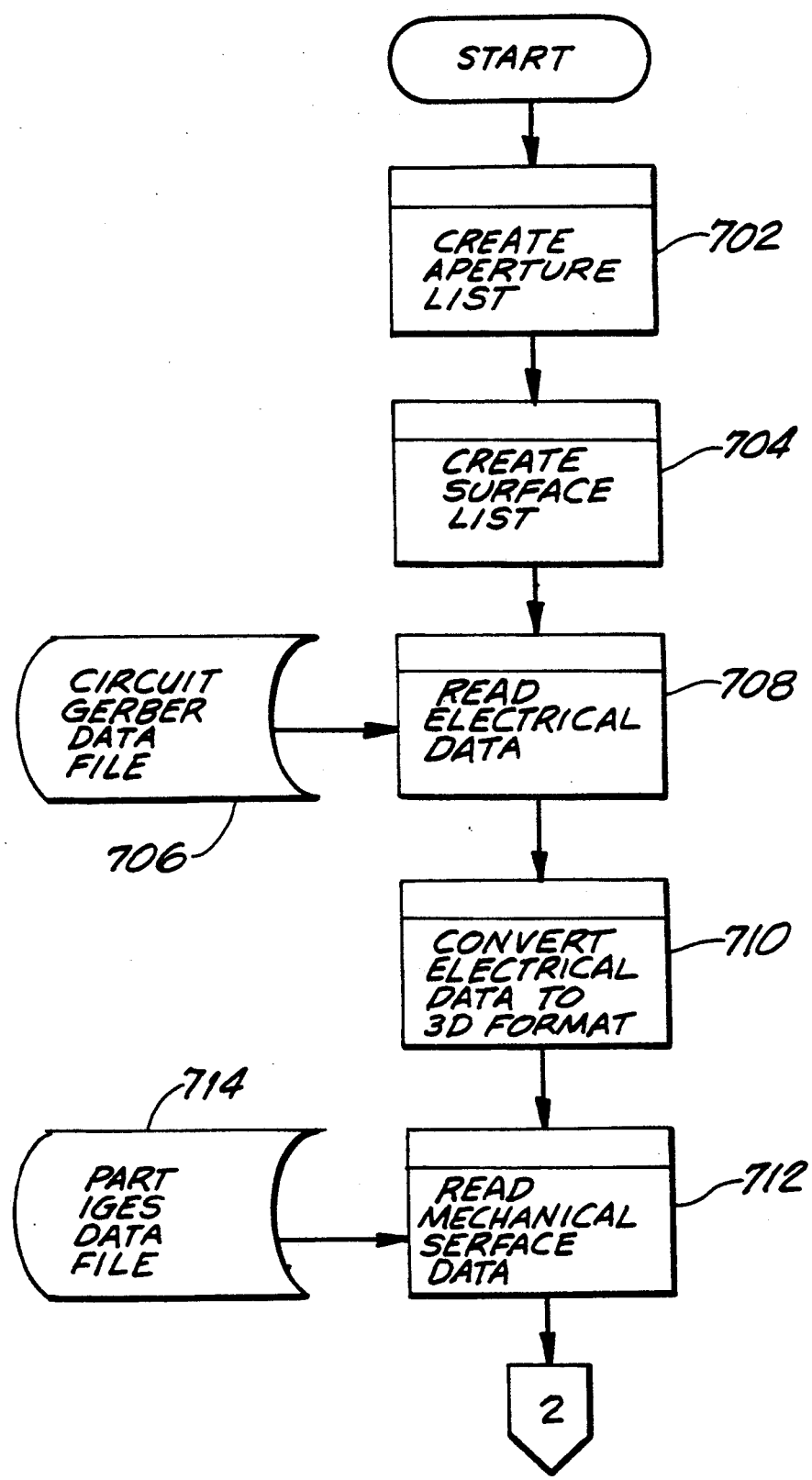

FIGS. 5-7 are a flow-chart diagram which illustrates the overall process of creating a MCB for a three-dimensional part. Steps 502, 504 and 506 relate to the design of the three-dimensional part, using the mechanical design package, and the creation of the IGES file describing the part. Steps 508 and 510 concern the creation of the two-dimensional surface outline from the three-dimensional part description. Steps 512, 602 and 604 relate to processes performed using the electrical package. These steps in FIGS. 5 and 6 are described in detail above.

Step 606 of FIG. 6 is implemented, in the present embodiment of the invention, by a program written in the computer language SMALLTALK. A source listing of this program is included as an appendix to the present application. The step 606 is briefly described above and is described in detail below with reference to FIGS. 7-10. As set forth above, this step produces an output data file which describes the circuit in three-dimensional space as it has been mapped onto the three-dimensional part.

In step 608, a test is made to determine if the output file is to be used to drive imaging equipment, in which case, the file is sent to the imager at step 610. Otherwise, at step 612, the file is used by the mechanical design system, together with the IGES file that describes the three-dimensional part (provided as an input 614 to the step 612), to generate, at step 616, commands for a numerically controlled machine tool. The machine tool, in turn, generates a three-dimensional mask which may be used, as set forth above, to print the circuit on the surface of the three-dimensional part.

Figure 8:
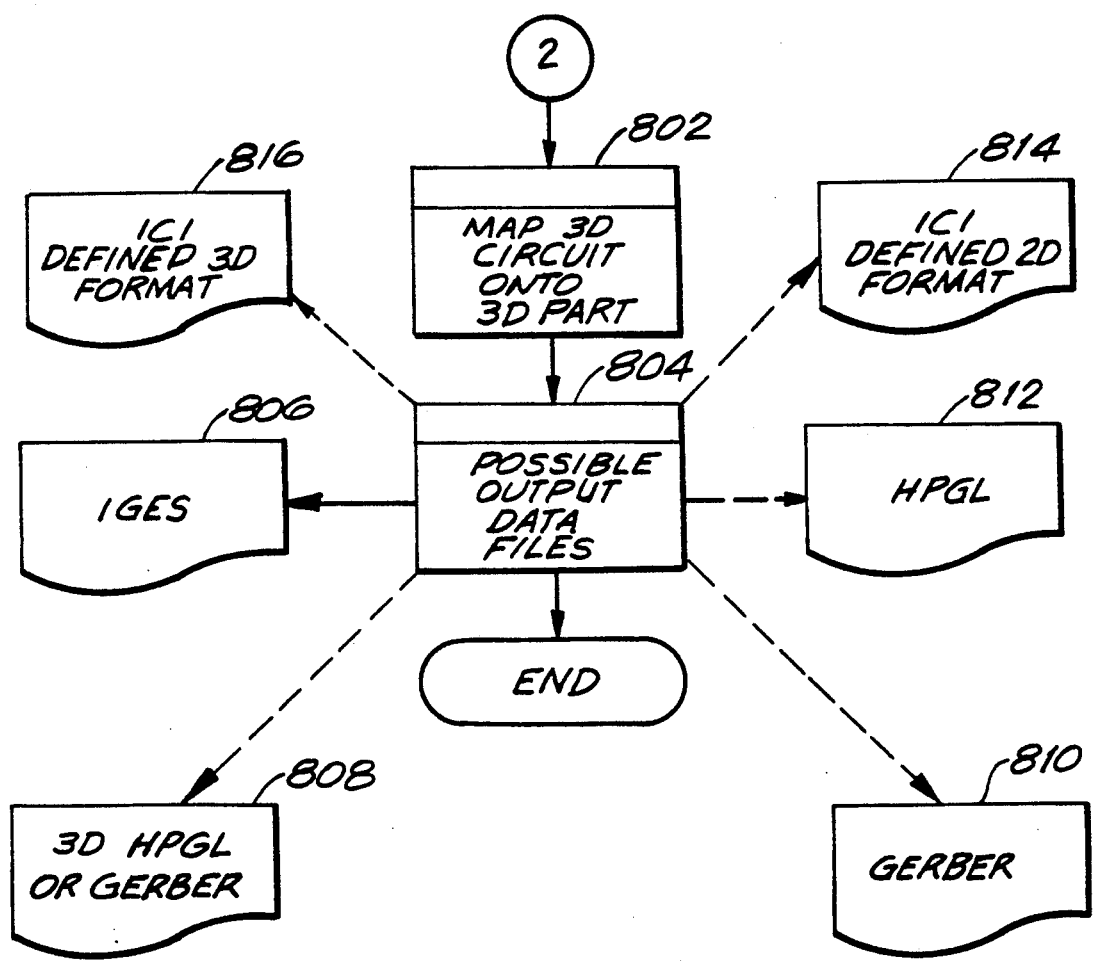

FIGS. 7 and 8 are a flow-chart diagram which provides greater detail on the process of mapping the two-dimensional circuit onto the three-dimensional object (step 606).

The first step in this program, 702, is to create an aperture list. This list is generated by the operator from data used to produce the GERBER circuit description file in the electrical package. This list defines the sizes of light beam apertures to be used by the photo-plotter to create images of the pads and traces on the photosensitive output medium.

In the next step, 704, the operator creates a surface list. This list defines the sequence in which surfaces of the three-dimensional object are to be evaluated to receive circuitry from the two-dimensional circuit diagram. This list is created by the operator from a list of surface identifiers for the three-dimensional object. These identifiers are taken from the IGES file.

At step 708, the program reads in the data describing the circuit from the GERBER data file 706. This data is put into three-dimensional format at step 710. In this step, each pad and each trace are defined in a format which allows for three dimensions, however, all of the third dimension values are set to zero. These third dimension values are provided later in the procedure. This step also generates separate TRACE and FLASH lists which include arrays of records that define the positions and dimensions of the respective traces and connecting pads in the two-dimensional circuit. A separate pair of lists is established for each surface of the three-dimensional object, however, at this time, all lists are empty except for the respective FLASH and TRACE lists that correspond to the first surface in the surface list. These two lists are initialized to include all of the respective flash and trace records for the two-dimensional circuit.

The next step, 712, reads the mechanical surface data from the IGES part file 714. In step 802, reached via the offpage connector 2, the three-dimensional circuit representation is mapped onto the three-dimensional part using the data from the IGES file. This step adds the third dimension to the circuit description that was generated at step 710.

Step 804 illustrates the possible output data formats of the three-dimensional circuit description generated at step 802. In the present embodiment of the invention, the output data is in the format of an IGES file. However, as illustrated in FIG. 8, output data files may be prepared in several two-dimensional and three-dimensional formats.

Figure 9:
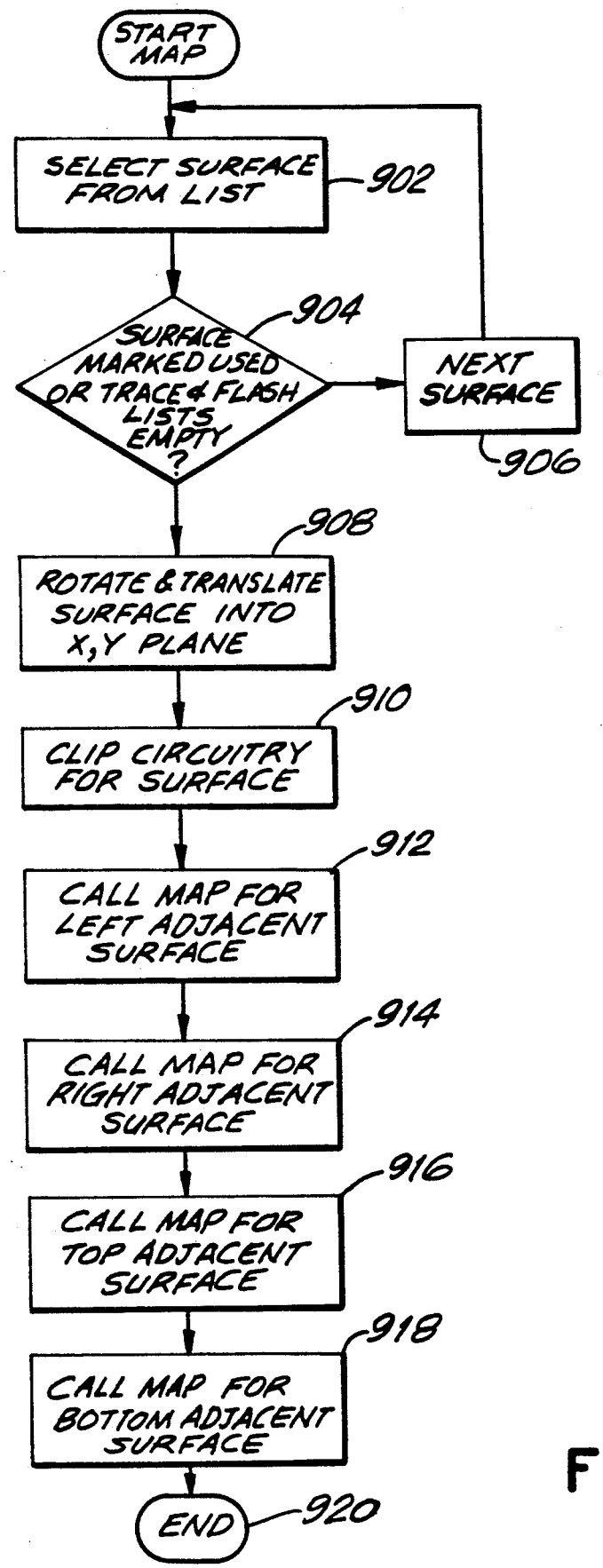
Figure 10:
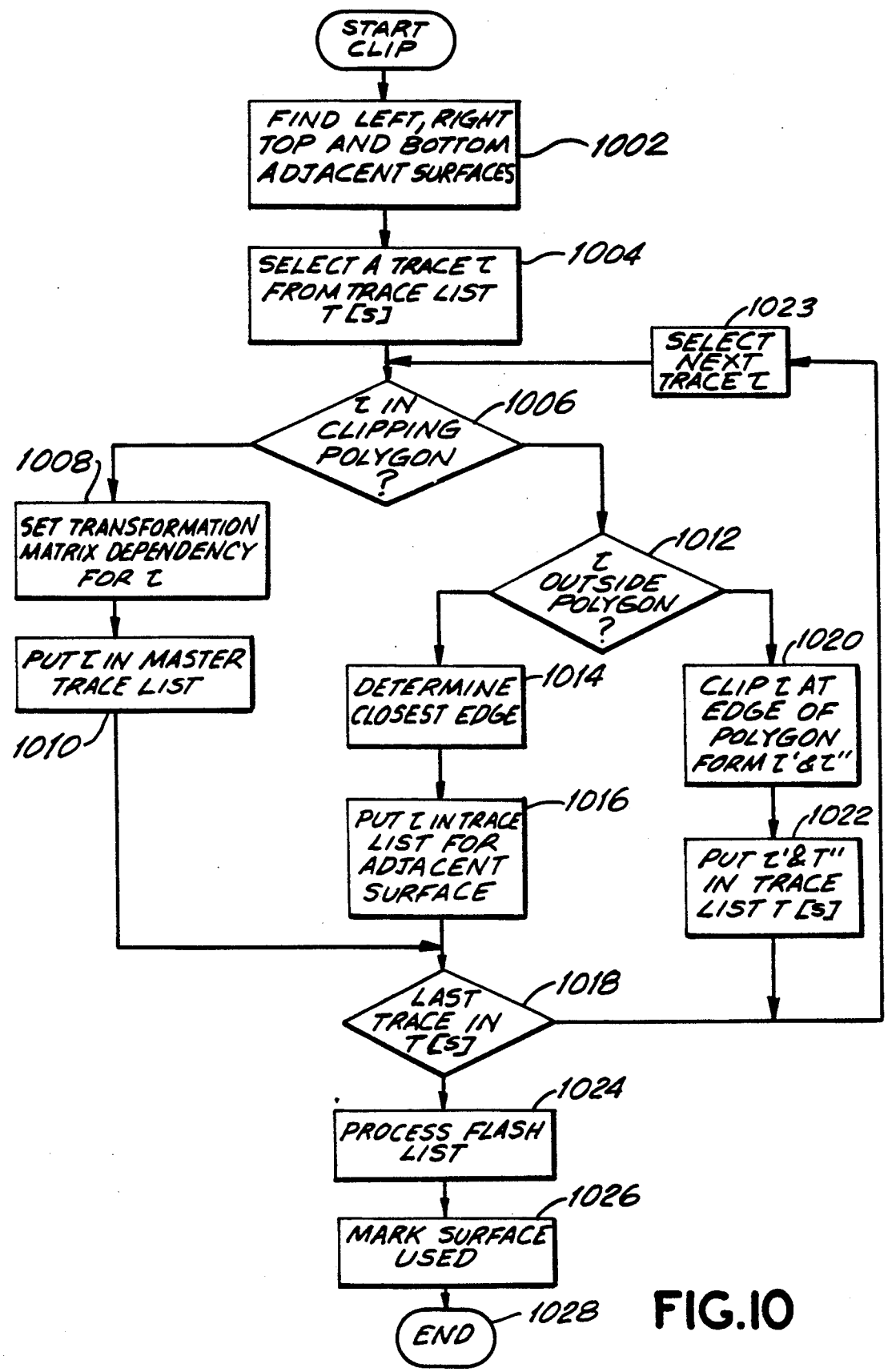

FIGS. 9 and 10 are flow-chart diagrams which show details of the step 802, described above. FIG. 9 is a flow-chart diagram of a procedure MAP, which is invoked at step 802, and FIG. 9 is a flow-chart diagram of a procedure CLIP which is invoked from the procedure MAP as set forth below.

The procedures MAP and CLIP fit the two-dimensional circuit onto the surface of the three-dimensional object. The fitting process may be analogized to the wrapping of the three-dimensional object with a sheet of paper representing the circuit. As each surface of the object is aligned with the sheet of paper, all circuitry which covers the surface is clipped out of the paper and saved. The clipped circuitry is marked as to the surface to which it belongs. This marking process establishes a dependency between portions of the circuit and respective surfaces of the three-dimensional object. That is to say, the location in space of a section of the circuitry is dependent on the position in space of the surface onto which it has been mapped. Following this analogy, the folding and clipping continues until there is no more circuitry to be mapped or until there are no more surfaces to be mapped onto. When this process is applied to a three-dimensional object having both interior and exterior surfaces, each of these surfaces is mapped separately and the results of the separate mappings are merged as a final step.

The first step in the MAP procedure is to select a surface from the surface list. If this is the first invocation of the procedure, the first entry in surface list is selected. Otherwise, the selected surface is determined by the invocation of the MAP procedure as set forth below.

At step 904, the selected surface is examined to determine if it has been used. If so, or if the TRACE and FLASH lists for the surface are empty, step 906 is executed to select the next surface. The FLASH and TRACE lists for the surfaces were established at step 710 above.

When a suitable surface has been selected, step 908 is executed to "rotate" and "translate" the selected surface into the X,Y plane. These operations are a mathematical translation of the representation of the three-dimensional object to achieve a surface representation having a normal vector which is parallel with the Z-axis. An exemplary method of performing the rotation is described in chapter 22 of a textbook by W. M. Newman et al, entitled *Principles of Interactive Computer Graphics*, McGraw Hill, 1979, pp 333-354, which is hereby incorporated by reference.

During the rotation and translation operations, the orienting point of the three-dimensional object is maintained as a reference point for the two-dimensional circuit diagram. Thus, when these operations are complete, there is a one-to-one correspondence between the target surface and a portion of the circuitry.

In step 910, the portion of the circuitry which is aligned with the target surface is clipped from the data structure created in step 710 and made dependent on the target surface. The clipping operation is described in detail below, in reference to FIG. 10.

In the next four steps, 912, 914, 916 and 918, the MAP procedure invokes itself recursively for each surface which is adjacent to the target surface, as indicated by the surface list. The steps 912, 914, 916 or 918 are executed if the surface list indicates that the target surface has respective left, right, top or bottom adjacent surfaces. These recursive invocations ensure that all surfaces of the three-dimensional object will be evaluated in the mapping process.

When all surfaces have been evaluated or when no remaining surface has entries in its TRACE or FLASH lists, step 920 terminates the mapping and clipping processes.

FIG. 10 illustrates the clipping procedure. This procedure is invoked in step 910 above. The clipping algorithm used in this embodiment of the invention is generally the same as the Cohen-Sutherland algorithm which is set forth in chapter 5, pages 65-67 of the above-referenced text by W. H. Newman et al., and is hereby incorporated by reference.

In the first step, 1002, of this procedure, the left, right top and bottom surfaces, if they exist, which are adjacent to the selected surface are identified. Next, at step 1004, a trace τ is selected from the TRACE list, T[s] for the selected surface s. At step 1006, the procedure determines if the trace τ is entirely within the clipping polygon defined by the selected surface. If so, a transformation matrix dependency for the trace τ is set, at step 1008, to indicate that the trace τ is mapped onto the surface s. Next, at step 1010, the trace τ is deleted from the TRACE list T[s] and placed in the master trace list.

If the trace τ is not entirely within the clipping polygon, it may be either entirely outside of, or partly inside and partly outside of the polygon. This determination is made at step 1012. If the trace is entirely outside of the polygon, step 1014 determines which edge of the polygon is closest to the trace and, at step 1016, assigns the trace to the TRACE list for the adjacent surface which shares that edge with the clipping polygon.

If the trace $\tau$ is only partly outside of the clipping polygon, the trace is clipped at the edge of the polygon to form two traces, $\tau'$ and $\tau''$ and both traces are inserted into the TRACE list T[s] for the selected surface s.

If, after steps 1010 or 1016, step 1018 determines that the last trace has not been processed; or unconditionally after step 1022, step 1023 is executed to select the next trace to be used as the trace $\tau$. Step 1023 branches to step 1006 which processes the trace $\tau$ as set forth above.

If, at step 1018, it is determined that the TRACE list for the selected surface is empty, step 1024 is executed which processes the FLASH list for the surface in substantially the same manner as described above. The processing of the FLASH lists is the same as the processing of the TRACE lists except that there is no analogue to steps 1020 and 1022 since, in this embodiment of the invention, a flash (connecting pad) may not be split across two surfaces. It is contemplated, however, that the system may be modified to accommodate such a split.

The final step, 1026, in the clipping procedure is to mark the selected surface s as used. This marking is tested in step 904 as set forth above.

It may be desirable to specify that some ruled surfaces of a three-dimensional object are not to be imprinted with circuitry. This may be accomplished, for example, by marking these surfaces as used before the mapping and clipping processes are performed.

A method of producing a printed circuit on the surface of a three-dimensional object has been described. While this invention has been described in terms of a preferred embodiment, it is contemplated that it may be practiced as outlined above within the spirit and scope of the appended claims.

The invention claimed is:

1. A method for generating a representation of a three-dimensional circuit which conforms to selected surfaces of a representation of a three-dimensional object comprising the steps of:
    a. generating the representation of the three-dimensional object as set of surfaces, where each surface in said set of surfaces is defined in terms of a shape and a position in space;
    b. mapping the representation of the three-dimensional object onto a two-dimensional map by concatenating the shape of the selected surfaces;
    c. placing circuit features corresponding to components of a two dimensional circuit on said two-dimensional map;
    d. routing circuit features corresponding to connections of components of said two-dimensional circuit on said two-dimensional map to generate a representation of a two-dimensional circuit;
    e. aligning one surface of the representation of the three-dimensional object in a coplanar relationship with the representation of the two-dimensional circuit;
    f. establishing a correspondence between said one surface of the three-dimensional object and a portion of the representation of said two-dimensional circuit;
    g. associating circuit features of said portion of the representation of the two-dimensional circuit with said one surface, and
    h. copying said associated circuit features to the three-dimensional representation of said circuit.

2. The method set forth in claim 1 further including the step of repeating steps e. through h. for each selected surface in the representation of the three-dimensional object.

3. The most set forth in claim 1 wherein the step e. is preceded by the step of defining an order in which the selected surfaces are processed by steps e. through h..

4. The method set forth in claim 1 further including the steps of:
    i. deleting said associated circuit features from the representation of the two-dimensional circuit; and
    j. repeating steps e. through i. until no circuit features of the representation of the two-dimensional circuit can be aligned with the selected surface of the representation of the three-dimensional object.

* * * * *